United States Patent
Chen et al.

(10) Patent No.: US 10,312,463 B2
(45) Date of Patent: Jun. 4, 2019

(54) LIGHT EMITTING MICROCAPSULE, METHOD OF PREPARING THE SAME AND OLED DISPLAY DEVICE COMPRISING THE SAME

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Changdi Chen, Beijing (CN); Sangman Yuk, Beijing (CN); Yiyong Luo, Beijing (CN); Tao Yang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 117 days.

(21) Appl. No.: 15/697,872

(22) Filed: Sep. 7, 2017

(65) Prior Publication Data

US 2017/0365807 A1 Dec. 21, 2017

Related U.S. Application Data

(62) Division of application No. 14/415,818, filed as application No. PCT/CN2014/076231 on Apr. 25, 2014, now abandoned.

(30) Foreign Application Priority Data

Dec. 26, 2013 (CN) .......................... 2013 1 0736306

(51) Int. Cl.
*H01L 51/50* (2006.01)
*H01L 51/52* (2006.01)
*H01L 51/00* (2006.01)

(52) U.S. Cl.
CPC ...... *H01L 51/5024* (2013.01); *H01L 51/5016* (2013.01); *H01L 51/5253* (2013.01); *H01L 51/0081* (2013.01); *H01L 51/0085* (2013.01); *H01L 51/0093* (2013.01)

(58) Field of Classification Search
CPC ............. H01L 51/5016; H01L 51/5024; H01L 51/5253; H01L 51/0081; H01L 51/0085; H01L 51/0093
See application file for complete search history.

(56) References Cited

U.S. PATENT DOCUMENTS

| | | | | |
|---|---|---|---|---|
| 5,911,923 | A | * | 6/1999 | Work ....................... B01J 13/18 264/4.7 |
| 2004/0113543 | A1 | * | 6/2004 | Daniels ............. H01L 27/14627 313/504 |
| 2006/0063125 | A1 | * | 3/2006 | Hamilton ................. A61C 9/00 433/70 |

FOREIGN PATENT DOCUMENTS

| | | |
|---|---|---|
| CN | 1615218 A | 5/2005 |
| CN | 101449626 A | 6/2009 |
| CN | 101787276 A | 7/2010 |
| CN | 102709481 A | 10/2012 |
| CN | 102916133 A | 2/2013 |
| CN | 103443242 A | 12/2013 |
| CN | 103459550 A | 12/2013 |
| CN | 103715370 A | 4/2014 |
| JP | 2002231447 A | 8/2002 |

OTHER PUBLICATIONS

International Application No. PCT/CN2014/076231, International Search report dated Sep. 12, 2014, thirteen (13) pages.
Form PCT/ISA/237 issued in International application No. PCT/CN2014/076231 dated Sep. 26, 2014.
1st office action issued in Chinese application No. 201310736306.9 dated Jul. 16, 2015.
Office Action dated Aug. 19, 2016 issued in corresponding Chinese Application No. 201310736306.9.

* cited by examiner

*Primary Examiner* — Irina S Zemel
(74) *Attorney, Agent, or Firm* — Nath, Goldberg & Meyer; Joshua B. Goldberg

(57) ABSTRACT

The present invention, which belongs to the technical field of display technology, provides a microcapsule, a method of preparing the same, and an OLED (organic light emitting diode) display device comprising the same. The OLED display device comprises a microcapsule having a phosphorescent material as a core material, which reduces the probability of the phosphorescence self-quenching and is isolated from water and oxygen, thereby improving the display quality and extending the service life of the OLED display device. Therefore, the OLED display device can solve the problem that the phosphorescence OLED display device in the prior art has a low brightness and short service life.

4 Claims, 1 Drawing Sheet

LIGHT EMITTING MICROCAPSULE, METHOD OF PREPARING THE SAME AND OLED DISPLAY DEVICE COMPRISING THE SAME

FIELD OF THE INVENTION

The present invention relates to the technical field of display technology. More particularly, the present invention relates to a light emitting microcapsule, a method of preparing the same, and an OLED (organic light emitting diode) display device comprising the same.

BACKGROUND OF THE INVENTION

The research of OLED devices has been developed comprehensively and thoroughly since the light emitting phenomena of organic molecules was discovered by Professor Qingyun Deng. OLED devices have been widely applied in the field of display technology because these devices have advantages of high efficiency, low power consumption, wide color gamut and the like. Based on the light emitting material, OLED can be substantially classified into two kinds, one comprising fluorescent material and the other comprising phosphorescent material. More attention has been paid to the phosphorescent material due to its high internal quantum efficiency.

However, the phosphorescent material tends to experience self-quenching for the triplet state of molecular excitation. Especially in the case of high current density, the phosphorescence material is more easily to suffer from a loss as a result of the self-quenching, thereby reducing the lightness of a phosphorescent OLED.

In addition, although the research and development techniques of the phosphorescent OLED devices has been relatively mature at a laboratory level, but there still exists some problems in practical, for example, the life of a phosphorescent OLED device is susceptible to the environment. It is well known that the phosphorescent OLED device is extremely susceptible to moisture and oxygen, especially the moisture. If the moisture permeates into the device, a dark spot in the light-emitting region, which will expand over time, is easily caused, thereby affecting the display quality and the life of the device. Currently, the occurrence and expanding of the black spots were prevented mainly by encapsulating the phosphorescent OLED devices. Encapsulation technology mainly includes cover plate encapsulation technology such as metal cover plate encapsulation technology and glass cover plate encapsulation technology and the like, and film encapsulation technology represented by Barix film encapsulation layer (developed by Vitex Systems Company). However, for these prior art, there are disadvantages such as surface irregularities (such as in the case of metal cover plate encapsulation) and occurrence of microcracks (such as in the case of glass cover plate encapsulation), as well as high-costs and the complicated production process (such as in the case of Barix thin film encapsulation).

SUMMARY OF THE INVENTION

One object of the present invention is to provide a light emitting microcapsule with improved lightness and prolonged life, and an OLED display device comprising this microcapsule, so as to solve the problem that the phosphorescent material in the light emitting layer of an OLED display device in the prior art tends to experience molecules quenching, thereby affecting the lightness; and the OLED display device is susceptible to moisture and oxygen, thereby forming black spots.

The above technical problem of the present invention can be solved by the microcapsule according to the present invention, which comprises a wall material and a core material encapsulated in the wall material. The core material is a phosphorescent material including (but not limited to) heavy metal complexes, such as Ir complexes, Pt complexes; rare earth metal complexes, such as Eu complexes, Tb complexes; other metal complexes, such as Cu complexes; or polymer comprising electroluminescence phosphorescent organometallic complexes. The wall material is a wall material capable of encapsulating the phosphorescent material. Furthermore, the wall material also has the effect to prevent moisture and/or oxygen in environment from permeating into the core material, and allow each microcapsule phosphorescent material isolated from each another so that the molecules quenching phenomenon can be avoided by preventing the aggregation of phosphorescent material. The wall material should have a transmittance greater than 90%, a moisture permeability less than 1 µg/(m².day), an oxygen permeability less than 1 mg/(m².day). The wall material includes (but are not limited to) natural polymeric material, such as gelatin, arabic gum, shellac, lac, starch, dextrin, wax, rosin, sodium alginate, zein, and the like; semi-synthetic polymer material, such as methyl cellulose, ethyl cellulose, carboxymethyl cellulose, hydroxyethyl ethyl cellulose; full-synthetic polymer material, such as polyolefins, polystyrenes, polyethers, polyureas, polyethylene glycol, polyamide, polyurethane, polyacrylate, epoxy resins and the like.

Preferably, the microcapsule has a particle size in a range of 0.5-200 µm.

Preferably, the phosphorescent material has a particle size in a range of 0.1-20 nm.

Preferably, the wall material is selected from any one of gelatin, ethyl cellulose and arabic gum.

The present invention also provides a method for preparing said microcapsules, wherein the phosphorescent material as a core material is wrapped in a suitable wall material to form the microcapsules. Depending on the kind of a wall material, a suitable method can be chosen for wrapping a wall material on a core material. The method for wrapping a core material includes, but are not limited to, chemical methods such as interfacial polymerization, in situ polymerization, molecular encapsulation, radiation encapsulation; physicochemical methods such as aqueous phase separation, oil phase separation, capsule-heart exchange, pressing, piercing, powder bed method; and physical methods, such as spray drying, spray freezing, air suspension, vacuum evaporation deposition, complex coacervation, long and short centrifugation.

Preferably, the wall material is wrapped on the core material by coacervation when any one of gelatin, ethyl cellulose and arabic gum is used as the wall material, thereby obtaining the above microcapsules.

The present invention also provides an OLED display device which comprises a light emitting material layer comprising the above-described microcapsules.

Preferably, the OLED display device further includes an electron transport layer, an electron injection layer and a cathode layer which are disposed sequentially on one side of the light emitting material layer; and a hole transport layer, a hole injection layer and a anode layer which are disposed sequentially on the other side of the light emitting material layer.

Preferably, the OLED display device further includes a thin film layer for encapsulation which is disposed on the side of the cathode opposite to the light emitting layer. Preferably, said thin film layer comprises a aluminum complex having the following molecular structure:

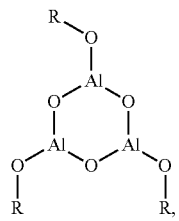

wherein R is alkyl, such as methyl, ethyl, propyl and the like.

In the present invention, phosphorescent material is microencapsulated so that the phosphorescent materials in adjacent microcapsules do not contact each other, and the amount of the phosphorescent material within each microcapsule is relatively small, thereby effectively reducing the quenching probability of the phosphorescence material due to the molecular stacking thereof, and further avoiding the phosphorescence losses due to the phosphorescence quenching and improving the lightness of phosphorescent OLED display device. Moreover, the phosphorescent material is wrapped in the microcapsule, and this effectively prevents the permeation of the moisture and/or oxygen in the environment, thereby reducing the probability of the reaction of the moisture and/or oxygen with the phosphorescent light emitting material, and further effectively extending the life of the phosphorescent material as well as improving the life of the phosphorescent OLED display device.

BRIEF DESCRIPTION OF THE DRAWINGS

FIG. 2 is a schematic sectional view of an OLED display device provided in an embodiment according to the present invention, wherein;

1. Microcapsules; 2. Phosphorescent material; 3. Base substrate;

4. Anode layer; 5. Hole injection layer; 6. Hole transport layer;

7. Light emitting material layer; 8. Electron transport layer;

9. Electron injection layer; 10. Cathode layer; 11. Thin film layer.

DETAILED DESCRIPTION OF CERTAIN EMBODIMENTS

Figure 1:
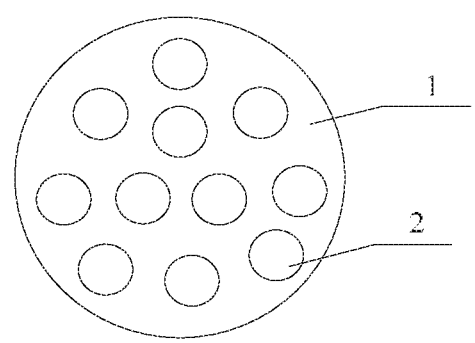
FIG. 1 shows a schematic sectional view of the microcapsule provided in an embodiment according to the present invention.

Embodiments of the present invention will be described in detail with reference to the accompanying figures, so that a person skilled in the art can get a better understanding of the technical solutions of the invention.
Preparation of Microcapsules As shown in FIG. 1, this embodiment provides a microcapsule 1 comprising a wall material and a core material, wherein the core material is phosphorescent material 2 and the wall material is a wall material capable of encapsulating the phosphorescent material.

Said phosphorescent material 2 can be a complex of iridium, such as a green phosphorescent material of Ir(ppy)$_3$, a blue phosphorescent material of FCNIr, a red phosphorescent material of Ir(pq)$_2$acac and the like, with the molecular structures shown below:

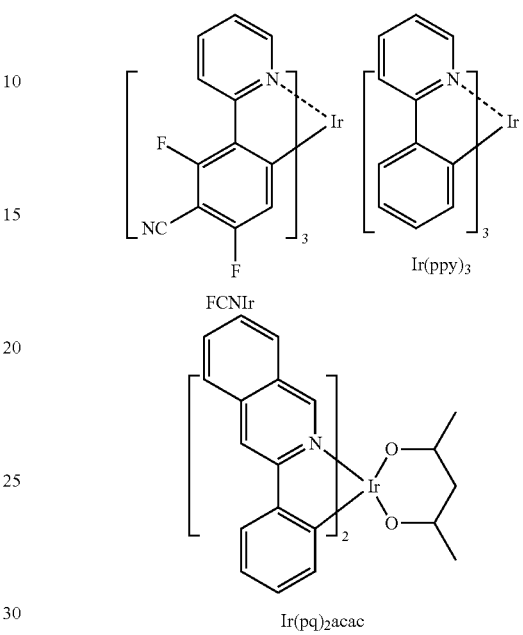

It should be understood that any of the phosphorescent materials in the prior art can be used as a core material of the microcapsules.

Preferably, the phosphorescent material 2 has a particle size in a range of 0.1 to 20 nm. Of course, the particle size of the phosphorescent material 2 can be smaller or larger based on the requirements of the encapsulating or the applications.

Preferably, the microcapsule 1 has a particle size in a range of 0.5 to 200 μm. Of course, the particle size of the microcapsule 1 can be smaller or larger based on the requirements of the encapsulating or the applications.

Preferably, the wall material is any one of gelatin, ethyl cellulose and arabic gum. Coacervation is suitable for preparing the microcapsules 1 from these wall materials.

The above-described microcapsules can be prepared by coacervation, which comprises the following steps (taking gelatin as an example):

dissolving the gelatin into n-hexane in a water bath at 50° C. to obtain a 6% gelatin solution; if necessary, the gelatin may be swelled with deionized water before the preparation of the gelatin solution;

Adding the green phosphorescent material of Ir(ppy)$_3$ powder having an average particle size of about 15 nm into the gelatin solution under stirring to form a emulsified dispersion system, adjusting the system with 10% acetic acid solution to pH 3.5-3.8 (preferably pH 3.5), and then slowly adding 20% sodium sulfate solution into the dispersion system while keeping the temperature thereof at 50° C.;

Decreasing the temperature of the dispersion system to 15° C., and allowing the gelatin wrap the green phosphorescent material of Ir(ppy)$_3$ powder as core material to form the microcapsule 1.

The obtained microcapsule has a particle size in a range of 1 μm to 50 μm.

It should be understood that other methods in the prior art, such as interfacial polymerization, may also be adopted for preparing the microcapsules 1. Accordingly, other materials besides the material described above can also be used as the wall material. Because the microencapsulation technology has been very mature, there is no need to describe other technologies in the prior art for preparing microcapsules from the core material of a phosphorescent material.

Preparation of OLED Display Device

Figure 2:
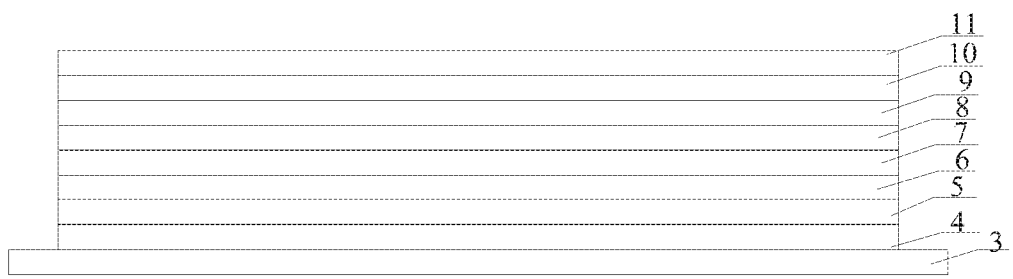

As shown in FIG. 2, this embodiment provides an OLED display device. The OLED display device may be a phosphorescent white OLED display device with a top emitting structure which comprises a base substrate 3, an anode layer 4, a hole injection layer 5, a hole transport layer 6, a light emitting material layer 7, an electron transport layer 8, an electron injection layer 9, a cathode layer 10 and a thin film layer for encapsulation 11.

The light emitting material layer 7 adopts a microencapsulated phosphorescent material.

The method for preparing an OLED display device of this embodiment comprises the steps of:

Preparation of Anode Layer 4

The anode layer 4 is deposited on the substrate 3 using indium tin oxide layer (ITO) which is a high work function material. Transparent carbon nanotubes (CNTs) and other materials may also be used as the anode layer. As for the material of the base substrate 3, glass is preferably used and other transparent materials such as plastic may also be used. The ITO anode layer may be obtained as an ITO thin film deposited on the glass substrate by vacuum magnetron sputtering which belongs to the prior art and do not need to be repeated herein.

Preparation of Hole Injection Layer 5

The hole injection layer 5 is deposited on the anode layer 4 by vacuum thermal evaporation deposition which belongs to the prior art and do not need to be repeated herein. The material forming the hole injection layer 5 may be copper phthalocyanine (CuPc) having a good hole injection capability, which is represented by the following molecular structure:

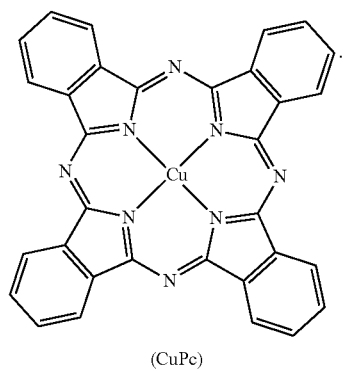

(CuPc)

Preparation of Hole Transport Layer 6

The hole transport layer 6 is deposited on the hole injection layer 5 by vacuum thermal evaporation deposition, The material forming the hole transport layer 6 may be TCTA having a good hole transport capability which is represented by the following molecular structure:

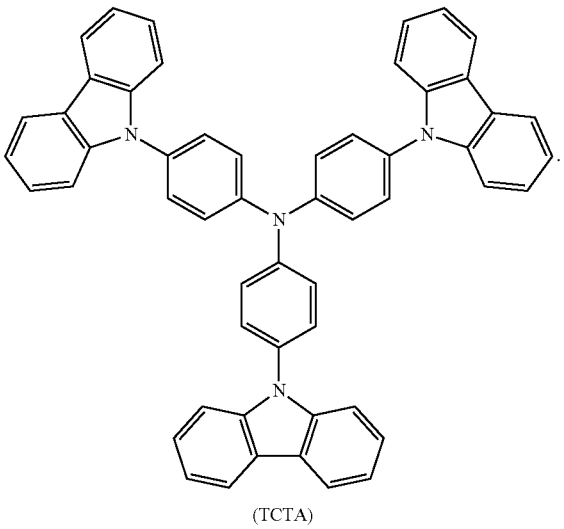 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

(TCTA)

Preparation of Light Emitting Material Layer 7

The light emitting material layer 7 is deposited on the hole transport layer 6 by vacuum thermal evaporation deposition. The light emitting material layer 7 includes a primary light emitting layer and the auxiliary light emitting layer, wherein the primary layer is a hybrid-type light emitting layer formed by co-doping microencapsulated green phosphorescent material of Ir(ppy)$_3$ and microencapsulated red phosphorescent material of Ir(pq)$_2$acac with TCTA and TAZ; the auxiliary light emitting layer is formed by doping microencapsulated blue phosphorescent material of FCNIr with mCP. The molecular structures of TAZ and mCP are as follows:

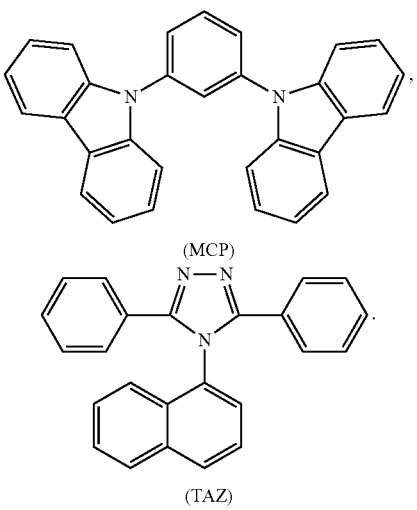

(MCP)

(TAZ)

According to the principle of colorimetry, the red, green, and blue light-emitting materials can be mixed in the same one light-emitting layer so as to generate white light by color mixing.

Preparation of Electron Transport Layer 8

The electron transport layer 8 is deposited on the light emitting material layer 7 by vacuum thermal evaporation deposition. The material for the electron transport layer 8 may be aluminum quinolinate (Alq3) having a good electron transport capability. The molecular structure of aluminum quinolinate is as follows:

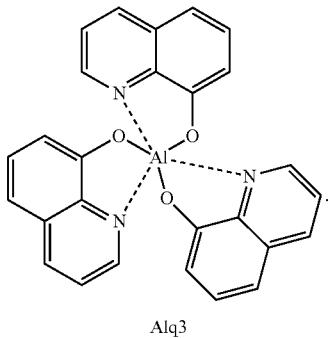

Alq3

Preparation of Electron Injection Layer 9:

The electron transport layer 9 is deposited on the electron transport layer 8 by vacuum thermal evaporation deposition. The material for the electron transport layer 9 may be a low work function material such as lithium fluoride (LiF) that has a good capability of electron injection.

Preparation of Cathode Layer 10

An Mg/Al cathode layer 10 having low resistance is deposited on the electron injection layer 9 by vacuum thermal evaporation deposition. A voltage is applied between the cathode layer 10 and the anode layer 4 by an external circuit. The electrons injected by the cathode and the holes injected by the anode meet in the light emitting layer and thus generate excitons, thereby exciting the light emitting material to emit light.

Thin Film Encapsulation

After preparing the phosphorescent OLED device, an encapsulating film layer 11 is formed on the phosphorescent OLED display device. At first a hydrocarbon solution containing the aluminum-based complex is rapidly evaporated and it is condensed on the substrate in the form of liquid under a vacuum environment, then the obtained film is dried: so that the entire phosphorescent OLED structure is completely sealed and planarized. The aluminum complex has a molecular structure as follows:

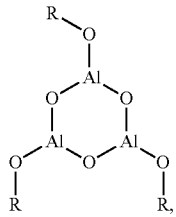

wherein R is an alkyl group such as methyl, ethyl, propyl and the like.

It should be understood that the encapsulating film layer 11 can also adopt other compounds capable of isolating water and oxygen, such as silicon-oxygen compounds, silicon-nitrogen compounds, polyethylene and the like.

By performing tests, compared with the OLED device using a phosphorescent material in the prior art, such as LG 55EA9800-CA 55 inch OLED smart 3D network TV, the above OLED display device using the phosphorescent microcapsules of the present invention as the light-emitting layer material has a brightness improved by 20% to 50% and a service life extended by 30% to 60%.

It can be seen that, for the light emitting microcapsule of the present invention, the phosphorescent materials in the adjacent microcapsules do not contact with each other due to the encapsulation of the phosphorescent material into microcapsules; and the phosphorescent materials are dispersedly distributed in each microcapsules, which lowers the probability of the molecules stacking generated by the contaction between the phosphorescent material molecules, and thus the probability of the phosphorescence self-quenching induced thereby can be reduced and the phosphorescence emission efficiency can be improved, resulting in a higher display brightness of the display device.

Meanwhile, since the phosphorescent materials are encapsulated in microcapsules, thus chemical reactions of the phosphorescent material with water and oxygen can be effectively reduced so that the adverse effects such as dark spots in the light emitting region can be avoided, and the display quality and life can be improved accordingly.

In summary, the microcapsules according to the present invention can improve the display brightness of a phosphorescent OLED display device and extend the service life of a phosphorescent OLED display device.

It is understood that the present invention is not limited to the above-illustrated embodiments, which were chosen and described in order to best explain the principles of the invention. Those skilled in the art can make various modifications or variations without departing from the spirit and essence of the present invention. It is intended that the scope of the invention be defined by the following claims and their equivalents.

What is claimed is:

1. An OLED display device including a light emitting material layer, wherein the light emitting material layer comprises a microcapsule comprising a wall material and a core material encapsulated in the wall material, wherein the core material is a phosphorescent material, and the wall material is selected from any one of gelatin, ethyl cellulose and arabic gum; and wherein the wall material has a transmittance greater than 90%, a moisture permeability less than 1 µg/(m2.day), and an oxygen permeability less than 1 mg/(m2.day).

2. The OLED display device according to claim 1, further including an electron transport layer, an electron injection layer and a cathode layer which are disposed sequentially on one side of the light emitting material layer, and a hole transport layer, a hole injection layer and a anode layer which are disposed sequentially on the other side of the light emitting material layer.

3. The OLED display device according to claim 2, further including a thin film layer for encapsulation which is disposed on the side of the cathode opposite to the light emitting layer.

4. The OLED display device according to claim 3, wherein the thin film layer comprises an aluminum-based complex having the following molecular structure:

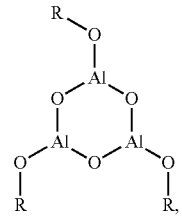

wherein R is alkyl.

* * * * *